United States Patent
Mittelholzer et al.

(10) Patent No.: US 9,996,418 B2
(45) Date of Patent: *Jun. 12, 2018

(54) ERROR-CORRECTION ENCODING AND DECODING

(71) Applicant: International Business Machines Corporation, Armonk, NY (US)

(72) Inventors: Thomas Mittelholzer, Rueschlikon (CH); Nikolaos Papandreou, Rueschlikon (CH); Thomas Parnell, Rueschlikon (CH); Charalampos Pozidis, Rueschlikon (CH)

(73) Assignee: International Business Machines Corporation, Armonk, NY (US)

( * ) Notice: Subject to any disclaimer, the term of this patent is extended or adjusted under 35 U.S.C. 154(b) by 216 days.

This patent is subject to a terminal disclaimer.

(21) Appl. No.: 14/675,955

(22) Filed: Apr. 1, 2015

(65) Prior Publication Data

US 2015/0309875 A1  Oct. 29, 2015

(30) Foreign Application Priority Data

Apr. 25, 2014 (GB) .................................. 1407279.7

(51) Int. Cl.
*G06F 11/00* (2006.01)
*G06F 11/10* (2006.01)
(Continued)

(52) U.S. Cl.
CPC ...... *G06F 11/1076* (2013.01); *G06F 11/1012* (2013.01); *H03M 13/152* (2013.01);
(Continued)

(58) Field of Classification Search
CPC ............... H03M 13/152; H03M 13/29; H03M 13/2903; H03M 13/2909; H03M 13/616; G06F 11/1076
(Continued)

(56) References Cited

U.S. PATENT DOCUMENTS 4,547,882 A * 10/1985 Tanner ................ G06F 11/1076
714/755
7,080,278 B1 * 7/2006 Kleiman ............. G06F 11/1076
714/6.24
(Continued)

FOREIGN PATENT DOCUMENTS

| CN | 101958720 B | 3/2013 | |
| TW | 201140567 | * 11/2011 | ............ C11B 20/18 |
| TW | 201140567 A | 11/2011 | |

OTHER PUBLICATIONS

List of IBM Patents or Patent Applications Treated as Related; CH920140005US1, Date Filed: Apr. 1, 2015, pp. 1-2.
(Continued)

*Primary Examiner* — Albert Decady
*Assistant Examiner* — Osman M Alshack
(74) *Attorney, Agent, or Firm* — Jared C. Chaney

(57) ABSTRACT

A data encoding method includes storing K input data symbols; assigning the symbols to respective symbol locations in a notional square array, having n rows and n columns of locations, to define a plurality of k-symbol words in respective rows; encoding the words by encoding rows and columns of the array dependent on a product code having identical row and column codes, each being a reversible error-correction code of dimension k and length n=2n', thereby to define a codeword, having $n^2$ code symbols corresponding to respective locations of the array, of a quarter product code defined by $C_Q = \{X - X^T - (X - X^T)^F : X \in C\}$ where X is an n by n-symbol matrix defining a codeword of the product code, $X^T$ is the transpose matrix of X, and $(X - X^T)^F$ is a reflection of matrix $(X - X^T)$ in the anti-diagonal thereof.

3 Claims, 10 Drawing Sheets

(51) Int. Cl.
*H03M 13/15* (2006.01)
*H03M 13/00* (2006.01)
*H03M 13/29* (2006.01)
*G11C 29/04* (2006.01)
*H03M 13/11* (2006.01)

(52) U.S. Cl.
CPC ... *H03M 13/2903* (2013.01); *H03M 13/2909* (2013.01); *H03M 13/616* (2013.01); *G11C 2029/0411* (2013.01); *H03M 13/1102* (2013.01)

(58) Field of Classification Search
USPC .......................................... 714/763, 764, 766
See application file for complete search history.

(56) References Cited

U.S. PATENT DOCUMENTS

| | | | | |
|---|---|---|---|---|
| 8,176,381 | B2 | 5/2012 | Djordjevic et al. | |
| 8,595,606 | B1* | 11/2013 | Feng | H03M 13/2909 714/800 |
| 9,112,529 | B1* | 8/2015 | Mazahreh | H03M 13/2721 |
| 2001/0050622 | A1* | 12/2001 | Hewitt | H03M 13/2903 341/50 |
| 2002/0147954 | A1* | 10/2002 | Shea | H03M 13/098 714/755 |
| 2004/0003336 | A1* | 1/2004 | Cypher | G11C 29/42 714/763 |
| 2012/0054585 | A1* | 3/2012 | Jiang | H03M 13/1111 714/777 |
| 2012/0063533 | A1 | 3/2012 | Fonseka et al. | |
| 2012/0260150 | A1* | 10/2012 | Cideciyan | G06F 11/1008 714/773 |
| 2013/0013974 | A1 | 1/2013 | Cideciyan et al. | |

OTHER PUBLICATIONS

Thomas Mittelholzer, et al., "Error-Correction Encoding and Decoding," U.S. Appl. No. 14/745,515, filed Jun. 22, 2015.

C. Yang, et al., "Product Code Schemes for Error Correction in MLC NAND Flash Memories," IEEE Transactions on Very Large Scale Integration (VLSI) Systems, vol. 20, Issue 12, Dec. 29, 2011, pp. 1-13.

IPO UK Search Report; Application No. GB1407279.7; Patents Act 1977: Search Report under Section 17(5); dated Oct. 10, 2014, pp. 1-4.

J. Justesen, "Performance of Product Codes and Related Structures with Iterated Decoding," Transactions Papers, IEEE Transactions on Communications, vol. 59, No. 2, Feb. 2011, pp. 407-415.

J. Justesen, et al., "Error Correcting Coding for OTN," ITU-T Optical Transport Network, IEEE Communications Magazine, Sep. 2010, pp. 70-75.

James L. Massey, "Reversible Codes," Information and Control, vol. 7, No. 3, Sep. 1964, pp. 369-380.

S. K. Muttoo, et al., "A Reversible Code Over GF(q)," Kybernetika, vol. 22, No. 1, 1986, pp. 1-8.

Vo Tam Van, et al., "A Novel Error Correcting System Based on Product Codes for Future Magnetic Recording Channels," IEEE Magnetics and Informational Theory, Jan. 2012, pp. 1-4.

* cited by examiner $$Y = \begin{bmatrix} 0 & y_{21} & \widehat{y_{31}} & y_{41} & y_{51} & y_{61} & y_{71} & 0 \\ y_{21} & 0 & y_{32} & y_{42} & y_{52} & y_{62} & 0 & y_{71} \\ \widehat{y_{31}} & y_{32} & 0 & y_{43} & y_{53} & 0 & y_{62} & y_{61} \\ y_{41} & y_{42} & y_{43} & 0 & 0 & y_{53} & y_{52} & y_{51} \\ y_{51} & y_{52} & y_{53} & 0 & 0 & y_{43} & y_{42} & y_{41} \\ y_{61} & y_{62} & 0 & y_{53} & y_{43} & 0 & y_{32} & \widehat{y_{31}} \\ y_{71} & 0 & y_{62} & y_{52} & y_{42} & y_{32} & 0 & y_{21} \\ 0 & y_{71} & y_{61} & y_{51} & y_{41} & \widehat{y_{31}} & y_{21} & 0 \end{bmatrix}$$

$$
\begin{matrix}
0 & \cdot & \cdot & \cdot & & & & & & & & & \cdot & \cdot & \cdot & 0 \\
\cdot & 0 & \cdot & \cdot & & & & & & & & & \cdot & \cdot & 0 & \cdot \\
\cdot & \cdot & 0 & \cdot & & & & & & & & & \cdot & 0 & \cdot & \cdot \\
\cdot & \cdot & \cdot & 0 & & & & & & & & & 0 & \cdot & \cdot & \cdot \\
p & p & p & p & 0 & u_{21} & u_{31} & u_{41} & u_{51} & u_{61} & u_{71} & 0 & p_{11} & p_{12} & p_{13} & p_{14} \\
p & p & p & p & u_{21} & 0 & u_{32} & u_{42} & u_{52} & u_{62} & 0 & u_{71} & p_{21} & p_{22} & p_{23} & p_{24} \\
p & p & p & p & u_{31} & u_{32} & 0 & u_{43} & u_{53} & 0 & u_{62} & u_{61} & p_{31} & p_{32} & p_{33} & p_{34} \\
p & p & p & p & u_{41} & u_{42} & u_{43} & 0 & 0 & u_{53} & u_{52} & u_{51} & p_{41} & p_{42} & p_{43} & p_{44} \\
\end{matrix}
$$

Figure 7

Figure 8 parallel encoding of $(n'-k'-1)$ columns $n'(n'-1) = 56$ output code symbols

Figure 10a $$\begin{matrix}
0 & \cdot & \cdot & \cdot & \cdot & \cdot & \cdot & \cdot & \cdot & \cdot & \cdot & 0 \\
\cdot & 0 & \cdot & \cdot & \cdot & \cdot & \cdot & \cdot & \cdot & \cdot & 0 & \cdot \\
\cdot & \cdot & 0 & \cdot & \cdot & \cdot & \cdot & \cdot & \cdot & 0 & \cdot & \cdot \\
\cdot & \cdot & \cdot & 0 & u_{21} & u_{31} & u_{41} & \cdot & \cdot & 0 & \cdot & \cdot \\
\cdot & \cdot & \cdot & u_{21} & 0 & u_{32} & u_{42} & u_{52} & u_{62} & 0 & \cdot & \cdot \\
\cdot & \cdot & \cdot & u_{31} & u_{32} & 0 & u_{43} & u_{53} & 0 & u_{62} & \cdot & \cdot \\
\cdot & \cdot & \cdot & u_{41} & u_{42} & u_{43} & 0 & 0 & u_{53} & u_{52} & \cdot & \cdot \\
\cdot & \cdot & \cdot & \cdot & \cdot & \cdot & 0 & 0 & \cdot & \cdot & \cdot & \cdot \\
\cdot & \cdot & \cdot & \cdot & \cdot & 0 & \cdot & \cdot & 0 & \cdot & \cdot & \cdot \\
\cdot & \cdot & \cdot & \cdot & 0 & \cdot & \cdot & \cdot & \cdot & 0 & \cdot & \cdot \\
\cdot & \cdot & \cdot & 0 & \cdot & \cdot & \cdot & \cdot & \cdot & 0 & \cdot & \cdot \\
\cdot & \cdot & 0 & \cdot & \cdot & \cdot & \cdot & \cdot & \cdot & \cdot & 0 & \cdot \\
\cdot & 0 & \cdot & \cdot & \cdot & \cdot & \cdot & \cdot & \cdot & \cdot & 0 & \cdot \\
0 & \cdot & \cdot & \cdot & \cdot & \cdot & \cdot & \cdot & \cdot & \cdot & \cdot & 0 \\
\end{matrix}$$

($k=7$)-symbol words in $k' = 3$ rows

Figure 10b $$\begin{matrix}
0 & \cdot & \cdot & \cdot & \cdot & \cdot & \cdot & \cdot & \cdot & \cdot & \cdot & 0 \\
\cdot & 0 & \cdot & \cdot & \cdot & \cdot & \cdot & \cdot & \cdot & \cdot & 0 & \cdot \\
\cdot & \cdot & 0 & \cdot & \cdot & \cdot & \cdot & \cdot & \cdot & 0 & \cdot & \cdot \\
\cdot & \cdot & \cdot & 0 & u_{21} & u_{31} & u_{41} & \cdot & \cdot & 0 & \cdot & \cdot \\
p & p & p & u_{21} & 0 & u_{32} & u_{42} & u_{52} & u_{62} & 0 & p_{11} & p_{12} & p_{13} & p_{14} \\
p & p & p & u_{31} & u_{32} & 0 & u_{43} & u_{53} & 0 & u_{62} & p_{21} & p_{22} & p_{23} & p_{24} \\
p & p & p & u_{41} & u_{42} & u_{43} & 0 & 0 & u_{53} & u_{52} & p_{31} & p_{32} & p_{33} & p_{34} \\
\cdot & \cdot & \cdot & \cdot & \cdot & \cdot & 0 & 0 & \cdot & \cdot & \cdot & \cdot \\
\cdot & \cdot & \cdot & \cdot & \cdot & 0 & \cdot & \cdot & 0 & \cdot & \cdot & \cdot \\
\cdot & \cdot & \cdot & \cdot & 0 & \cdot & \cdot & \cdot & \cdot & 0 & \cdot & \cdot \\
\cdot & \cdot & \cdot & 0 & \cdot & \cdot & \cdot & \cdot & \cdot & 0 & \cdot & \cdot \\
\cdot & \cdot & 0 & \cdot & \cdot & \cdot & \cdot & \cdot & \cdot & \cdot & 0 & \cdot \\
\cdot & 0 & \cdot & \cdot & \cdot & \cdot & \cdot & \cdot & \cdot & \cdot & 0 & \cdot \\
0 & \cdot & \cdot & \cdot & \cdot & \cdot & \cdot & \cdot & \cdot & \cdot & \cdot & 0 \\
\end{matrix}$$

parallel encoding of $k'$ rows

Figure 10c $$\begin{matrix}
0 & \cdot & \cdot & p_1" & \cdot & \cdot & \cdot & \cdot & \cdot & \cdot & \cdot & 0 \\
\cdot & 0 & \cdot & p_2" & \cdot & \cdot & \cdot & \cdot & \cdot & \cdot & 0 & \cdot \\
\cdot & \cdot & 0 & p_3" & \cdot & \cdot & \cdot & \cdot & \cdot & 0 & \cdot & \cdot \\
\cdot & \cdot & \cdot & 0 & u_{21} u_{31} u_{41} & \cdot & \cdot & 0 & \cdot & \cdot & \cdot \\
p & p & p & u_{21} & 0 & u_{32} u_{42} u_{52} u_{62} & 0 & p_{11} p_{12} p_{13} p_{14} \\
p & p & p & u_{31} & u_{32} 0 & u_{43} u_{53} & 0 & u_{62} & p_{21} p_{22} p_{23} p_{24} \\
p & p & p & u_{41} & u_{42} u_{43} 0 & 0 & u_{53} u_{52} & p_{31} p_{32} p_{33} p_{34} \\
p_{31} p_{32} p_{33} p_{34} & \cdot & \cdot & 0 & 0 & \cdot & \cdot & \cdot & \cdot \\
p_{21} p_{22} p_{23} p_{24} & \cdot & 0 & \cdot & \cdot & 0 & \cdot & \cdot & \cdot \\
p_{11} p_{12} p_{13} p_{14} & 0 & \cdot & \cdot & \cdot & \cdot & 0 & \cdot & \cdot \\
\cdot & \cdot & \cdot & 0 & \cdot & \cdot & \cdot & \cdot & \cdot & 0 \\
\cdot & \cdot & 0 & p_4" & \cdot & \cdot & \cdot & \cdot & 0 & \cdot & \cdot \\
\cdot & 0 & \cdot & p_5" & \cdot & \cdot & \cdot & \cdot & \cdot & 0 & \cdot \\
0 & \cdot & \cdot & p_6" & \cdot & \cdot & \cdot & \cdot & \cdot & \cdot & 0
\end{matrix}$$

single column encoding

Figure 10d $$\begin{matrix}
0 & p" & p" & p_1' & \cdot & \cdot & \cdot & \cdot & \cdot & \cdot & \cdot & 0 \\
p" & 0 & p" & p_2' & \cdot & \cdot & \cdot & \cdot & \cdot & \cdot & 0 & \cdot \\
p" & p" & 0 & p_3' & \cdot & \cdot & \cdot & \cdot & \cdot & 0 & \cdot & \cdot \\
p_1' & p_2' & p_3' & 0 & u_{21} u_{31} u_{41} & \cdot & \cdot & 0 & \cdot & \cdot & \cdot \\
p & p & p & u_{21} 0 & u_{32} u_{42} u_{52} u_{62} & 0 & p_{11} p_{12} p_{13} p_{14} \\
p & p & p & u_{31} u_{32} 0 & u_{43} u_{53} & 0 & u_{62} & p_{21} p_{22} p_{23} p_{24} \\
p & p & p & u_{41} u_{42} u_{43} 0 & 0 & u_{53} u_{52} & p_{31} p_{32} p_{33} p_{34} \\
p_{31} p_{32} p_{33} p_{34} & \cdot & \cdot & 0 & 0 & \cdot & \cdot & \cdot & \cdot \\
p_{21} p_{22} p_{23} p_{24} & \cdot & 0 & \cdot & \cdot & 0 & \cdot & \cdot & \cdot \\
p_{11} p_{12} p_{13} p_{14} & 0 & \cdot & \cdot & \cdot & \cdot & 0 & \cdot & \cdot \\
p" & p" & p" & 0 & \cdot & \cdot & \cdot & \cdot & 0 & \cdot & \cdot \\
p" & p" & 0 & p_4' & \cdot & \cdot & \cdot & \cdot & \cdot & 0 & \cdot \\
p" & 0 & p" & p_5' & \cdot & \cdot & \cdot & \cdot & \cdot & 0 & \cdot \\
0 & p" & p" & p_6' & \cdot & \cdot & \cdot & \cdot & \cdot & \cdot & 0
\end{matrix}$$

parallel encoding of $(n'-k'-1)$ columns

Figure 10e

| Type of Code | Length N | Rate R | Component Codes extended BCH($n_i,k_i,t_i$) | Raw BER @ $10^{-15}$-target |
|---|---|---|---|---|
| TPC | 140,800 | 0.856 | (400, 372, $t_1$=3) (352, 324, $t_2$=3) | 0.0116 |
| TPC | 80,640 | 0.844 | (224, 205, $t_1$=2) (360, 332, $t_2$=3) | 0.0065 error floor ! |
| QPC | 79,242 | 0.860 | (2n'=564, 523, t=4) | 0.0095 |
| HPC | 79,003 | 0.864 | (2n'=398, 370, t=3) | 0.0063 error floor ! |

ERROR-CORRECTION ENCODING AND DECODING

FOREIGN PRIORITY

This application claims priority to Great Britain Patent Application No. 1407279.7, filed Apr. 25, 2014, and all the benefits accruing therefrom under 35 U.S.C. § 119, the contents of which in its entirety are herein incorporated by reference.

BACKGROUND

This invention relates to encoding and decoding of data for error-correction purposes in data storage and communications systems. Methods, apparatus and computer programs are provided for encoding data supplied to a data channel, together with corresponding decoding systems and data storage and communications systems employing same.

Error-correction encoding is employed in data storage and communications systems to improve the accuracy with which data can be recovered from the data channel. By encoding data in accordance with an error-correction code (ECC) before supply to the channel, errors at the channel output can be identified and corrected to an extent dependent on the properties of the code. Numerous such ECC schemes are known. One well-known class of ECC scheme is based on product codes. A product code uses two component ECC codes to encode rows and columns of a notional two-dimensional array of input data. The basic principle of these codes is indicated in FIG. 1 of the accompanying drawings and is described briefly below.

The basic structure of an exemplary product code is illustrated schematically in FIG. 1. The input data symbols (which in general may be $q^{ary}$ symbols, having q possible symbol values, where q≥2) are assigned to respective symbol locations in a notional array having $n_2$ rows and $n_1$ columns of symbol locations. In this example, $k_2 \times k_1$ data symbols are assigned to respective locations in a $k_2$ by $k_1$ subarray at the intersection of the first $k_2$ rows and first $k_1$ columns of the $n_2$ by $n_1$ array. The resulting array of input data symbols is encoded by separately encoding the rows and columns of the array. A first ECC code C1 is used to encode the $k_1$-symbol data word in each row of the array into a length-$n_1$ C1 codeword. This example uses systematic encoding, whereby the input data is retained in the codeword. In particular, the $n_1$ code symbols of a C1 codeword are obtained by adding $(n_1-k_1)$ parity symbols after the $k_1$-symbol data word in a given row. A second ECC code C2 is then used to encode the $k_2$-symbols in each column of the array into a length-$n_2$ C2 codeword, here by adding $(n_2-k_2)$ parity symbols at the end of each column. The resulting $n_2 \times n_1$ code symbols in the array form the output codeword of the product code. In an extension of this basic idea, an interleaved product code applies the C2 code over s>1 evenly spaced columns of the array, resulting in $n_2$/s C2 codewords.

Product codes can offer practical encoder/decoder implementations, their decoders being hard-decision based and thus avoiding the various complexity/latency issues associated with soft-decision decoding. Some decoders for interleaved product codes use the technique of iterative decoding based on a graph defined from the basic code structure. Briefly, a bipartite graph can be defined with $n_2$ right nodes, each corresponding to a C1 codeword, and $n_2$/s left nodes corresponding to respective C2 codewords. Each right node is connected to each left node by s edges. The s edges connecting a pair of nodes represent the s common symbols at the intersections of the C1 and C2 codewords for those nodes in the notional array described above. Iterative decoding is performed based on the graph by decoding the C1 codewords one-by-one, then decoding the C2 codewords one-by-one. Each time a codeword is successfully decoded, the edges leaving the appropriate node are corrected. The process iterates until decoding is complete.

Another ECC scheme based on product codes is proposed in the context of optical transmission networks in 'Error correcting coding for OTN', J. Justesen, IEEE Communications Magazine, September 2010, and 'Performance of Product Codes and Related Structures with Iterative Decoding', J. Justesen, IEEE Transactions on Communications, 2011. These codes, referred to as "half product codes", are based on product codes which use identical codes for the row code C1 and the column code C2. If each component code C1 and C2 is a rate k/n code with a code length (i.e., number of symbols in a codeword) of n, and a dimension (i.e., number of data symbols encoded into each codeword) of k, then the resulting product code C has length $N=n^2$, dimension $K=k^2$, and rate $(k/n)^2$. A codeword of C can be defined by an (n by n)-symbol matrix X corresponding to the notional array described above, where each row and column of X is a codeword of the row/column code. The corresponding half product code $C_H$ is then defined by $$C_H = \{X - X^T : X \in C\}$$

where $X^T$ is the transpose matrix of X. Note that, if X is a codeword then so is $X^T$ because the row and column codes are the same. By construction, every codeword $Y_H$ of $C_H$ has a zero diagonal (where the diagonal is defined here as the line of symbols extending diagonally across the (n by n)-symbol matrix $Y_H$ from the top left symbol to the bottom right symbol). That is, all symbols on the diagonal are of value zero. Since it follows from the definition of $C_H$ that $Y_H = Y_H^T$, the set of $n(n-1)/2$ symbols in the triangular subarray on each side of the diagonal is the same. These $n(n-1)/2$ symbols thus define the codeword $Y_H$ whereby the half product code has an effective length of $N_H = n(n-1)/2$.

Encoding is done as for product codes, but the input data is restricted to the triangular subarray on one side of the diagonal, giving a dimension of $K_H = k(k-1)/2$ for the half product code.

SUMMARY

In one embodiment, a data encoding method includes storing, by a processing device, K input data symbols; assigning the K input data symbols to respective symbol locations in a notional square array, having n rows and n columns of symbol locations, to define a plurality of k-symbol words in respective rows of the array; encoding the k-symbol words by encoding rows and columns of the array in dependence on a product code C having identical row and column codes, each being a reversible error-correction code of dimension k and length n=2n', thereby to define a codeword, having $n^2$ code symbols corresponding to respective locations of the array, of a quarter product code $C_Q$ defined by $C_Q = \{X - X^T - (X - X^T)^F : X \in C\}$ where X is an (n by n)-symbol matrix defining a codeword of the product code C, $X^T$ is the transpose matrix of X, and $(X - X^T)^F$ is a reflection of matrix $(X - X^T)$ in the anti-diagonal thereof; and outputting to a data channel the n'(n'-1) code symbols in the codeword of $C_Q$ which correspond to respective locations in a triangular subarray confined between the diagonal and anti-diagonal of the array.

In another embodiment, a data encoder includes memory for storing K input data symbols, and encoder logic adapted to: assign the K input data symbols to respective symbol locations in a notional square array, having n rows and n columns of symbol locations, to define a plurality of k-symbol words in respective rows of the array; encode the k-symbol words by encoding rows and columns of the array in dependence on a product code C having identical row and column codes, each being a reversible error-correction code of dimension k and length n=2n', thereby to define a codeword, having $n^2$ code symbols corresponding to respective locations of the array, of a quarter product code $C_Q$ defined by $C_Q=\{X-X^T-(X-X^T)^F: X \in C\}$ where X is an (n by n)-symbol matrix defining a codeword of the product code C, $X^T$ is the transpose matrix of X, and $(X-X^T)^F$ is a reflection of matrix $(X-X^T)$ in the anti-diagonal thereof; and output to a data channel the n'(n'-1) code symbols in the codeword of $C_Q$ which correspond to respective locations in a triangular subarray confined between the diagonal and anti-diagonal of the array.

BRIEF DESCRIPTION OF THE DRAWINGS

FIG. 4 illustrates the symmetrical structure of an exemplary quarter product codeword;

FIGS. 5a and 5b illustrate assignment of symbols to notional array locations for encoding by the FIG. 3 encoder;

FIG. 6 illustrates a row encoding stage in operation of the encoder;

FIG. 7 illustrates assignment of code symbols to mirror locations in the array for a column encoding stage;

FIG. 8 illustrates the column encoding stage in operation of the encoder;

FIG. 9 indicates selection of output symbols for the encoding operation;

FIGS. 10a, 10b, 10c, 10d and 10e illustrate successive stages in another encoding method in the FIG. 2 encoder;

DETAILED DESCRIPTION

Figure 1:
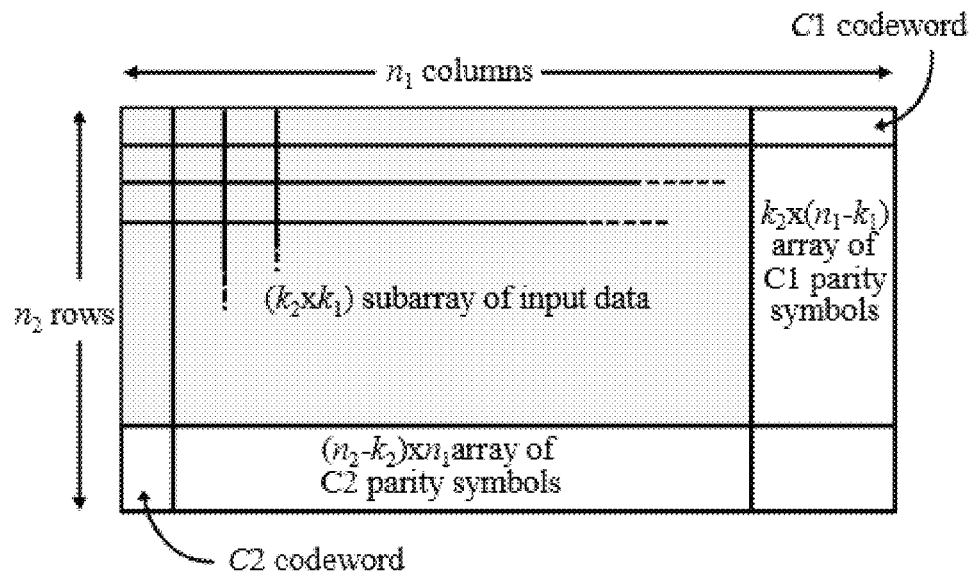
FIG. 1 (Prior Art) illustrates codeword construction for an exemplary product code.

Ideally an ECC scheme should support the performance criteria, e.g., as to code rate, length, reliability, etc., required by applications and also permit simple, efficient encoder/decoder implementations. Schemes offering flexibility of code design to meet a range of requirements are also advantageous. However, many coding schemes are limited in their application due to inherent properties of the ECC code. By way of example, the most recent consumer-grade 19 nm MLC (multi-level cell) NAND flash memory chips require a BCH (Bose Chaudhuri Hocquenghem) code capable of correcting 40-bits per 1 KB codeword in order to achieve their specification (3000 program/erase cycles and 1 year data retention time). Beyond 3000 program/erase cycles the raw bit-error rate of the flash cells increases quickly, resulting in error-patterns that are uncorrectable using the standard ECC scheme. One way to extend endurance is simply to use a more powerful BCH code. However, to achieve significant endurance improvement (e.g., more than 10K program/erase cycles) it is necessary that the ECC scheme can cope with a raw bit error rate approaching 1% while retaining a high coding rate. The implementation of such a BCH code is infeasible using technology available at present or envisaged in the near future. ECC schemes which are based on low-density parity check (LDPC) codes and include a soft decoding stage offer a potential alternative. However it is difficult to generate soft outputs for flash: multiple reads are needed, voltage read levels must be selected carefully, and a significant latency penalty is incurred. Hardware implementations of soft-decoding algorithms typically have a large gate count, and performance at operational uncorrectable bit error rate is difficult to determine due to the characteristic error floor behaviour of LDPC codes.

An embodiment of a first aspect of the present invention provides a data encoding method including: storing K input data symbols; assigning the K input data symbols to respective symbol locations in a notional square array, having n rows and n columns of symbol locations, to define a plurality of k-symbol words in respective rows of the array; encoding the k-symbol words by encoding rows and columns of the array in dependence on a product code C having identical row and column codes, each being a reversible error-correction code of dimension k and length n=2n', thereby to define a codeword, having $n^2$ code symbols corresponding to respective locations of the array, of a quarter product code $C_Q$ defined by $C_Q=\{X-X^T-(X-X^T)^F: X \in C\}$ where X is an (n by n)-symbol matrix defining a codeword of the product code C, $X^T$ is the transpose matrix of X, and $(X-X^T)^F$ is a reflection of matrix $(X-X^T)$ in the anti-diagonal thereof; and outputting to a data channel the n'(n'-1) code symbols in the codeword of $C_Q$ which correspond to respective locations in a triangular subarray confined between the diagonal and anti-diagonal of the array.

Data encoding methods embodying this invention are based on a class of codes proposed herein and referred to as "quarter product codes". These codes are based on an underlying product code with row and columns codes which are not only identical but also reversible. With a reversible code, reversing the symbol order of any codeword produces another codeword of the code. Coding and decoding can be based on the underlying product code C, offering practical encoder/decoder implementations for quarter product codes. In particular, after assigning the input data symbols to locations in the notional array, row and columns of the array are encoded in dependence on the product code so as to produce a codeword given by $X-X^T-(X-X^T)^F$, where $X \in C$. Such a quarter product codeword has an additional degree of symmetry compared to the half product codes discussed earlier. This is due to the term $(X-X^T)^F$ which is a reflection of matrix $(X-X^T)$ in the anti-diagonal, i.e., the matrix obtained by flipping all symbols of $(X-X^T)$ on the anti-diagonal (defined here as the line of symbols extending diagonally across the (n by n)-symbol matrix from the top right symbol to the bottom left symbol). By construction, the array of code symbols defining every codeword of a quarter product code $C_Q$ has a zero diagonal and a zero anti-diagonal. By virtue of the symmetry, the set of n'(n'−1) code symbols corresponding to locations in each triangular subarray confined between the diagonal and anti-diagonal are the same. These n'(n'−1) code symbols thus define the quarter product codeword, whereby the quarter product code has an effective length of $N_Q$=n'(n'−1), less than half that of an equivalent half product code. For a given code length, encoding methods embodying the invention permit use of longer, stronger component codes which perform better and lead to less miscorrection on decoding. This offers ECC schemes with exceptional performance even at small code lengths. By way of example, embodiments of the invention can meet desired performance criteria in NAND flash applications with 8 kB page format, as well as giving increased read bandwidth with larger page formats. In general, methods embodying the invention offer enhanced flexibility in the construction of strong ECC schemes for various applications, while providing practical, complexity-efficient encoder/decoder implementations.

The assignment of input data symbols to locations in the notional array can be effected in various ways. The assignment may be conveniently defined via the act of storing the input data symbols in memory, e.g., based on a predefined mapping between physical memory locations and notional array locations. The data symbols are assigned so as to define (typically together with additional symbols discussed below such as symbols on the diagonal/anti-diagonal and symbols defined by symmetry) the k-symbol words in respective rows of the array. To encode these k-symbol words, encoding is performed on rows and columns of the array so as to define the $n^2$ code symbols of the quarter product codeword. Note that it is not necessary to generate all $n^2$ code symbols here, but only sufficient code symbols to fully define the codeword taking account of inherent symmetries. Note also that what is considered to be a "row" and a "column" of the notional array is a matter of selection according to deemed array orientation, whereby "rows" and "columns" are effectively interchangeable herein.

After encoding into the quarter product codeword, the set of n'(n'−1) code symbols corresponding to locations in a triangular subarray confined between the diagonal and anti-diagonal of the array are output to the data channel. Note here that, due to inherent symmetries in the codeword mentioned above, the same symbol necessarily appears at multiple array locations. Symbols corresponding to locations in the triangular subarray can thus be selected from multiple array locations as convenient. This will be explained further below. The key point is that the resulting set of n'(n'−1) code symbols output to the channel are the same symbols which appear at locations in the aforementioned triangular subarray. These code symbols may be output directly or indirectly to the channel, whereby the symbols may be subject to further processing by intervening circuitry prior to supply to the channel.

For particularly efficient implementation in preferred embodiments, the encoding of the k-symbol words can be performed by systematic encoding. However, embodiments using non-systematic encoding can of course be envisaged. Embodiments may include the step of assigning further symbols, each of value zero, to locations on the diagonal and anti-diagonal of the array, whereby the k-symbol words are defined by the K input data symbols and at least some of the further symbols. In the systematic embodiments to be described, the further, zero-value symbols are assigned to all locations on the diagonals (the plural "diagonals" being used herein to mean the diagonal and the anti-diagonal collectively) as these symbols are required by the definition of $C_Q$. Each k-symbol word may then include two zero-symbols, one on each of the diagonal and anti-diagonal. If k is even, i.e., k=2k', then K can be given by K=k'(k'−1). If k is odd, i.e., k=(2k'+1), then K can be given by K=k'$^2$.

Particularly preferred embodiments include assigning the K input data symbols to a set of locations extending from the diagonal to the anti-diagonal and closest to the center of the array, and assigning like symbols to mirror locations of the set by reflecting the input data symbols at the set of locations in the diagonal and anti-diagonal of the array, thereby to define the k-symbol words in respective successive rows adjacent the center of the array. The step of encoding the k-symbol words may then include encoding each of the successive rows to obtain n code symbols for the row, and assigning like code symbols to mirror locations of locations in the successive rows by reflecting code symbols in these rows in the diagonal and anti-diagonal of the array, thereby to define a subset of the $n^2$ code symbols for the array. Sufficient columns of the array are then encoded to define the remainder of the $n^2$ code symbols for the array. These features are explained in more detail below.

In some embodiments the data channel may be a recording channel.

Hence, an embodiment of a second aspect of the invention provides a data storage method including: encoding each of successive groups of K input data symbols by a method according to the first aspect of the invention, wherein the n'(n'−1) code symbols are output to a recording channel comprising a data storage medium; and storing on the data storage medium the n'(n'−1) code symbols obtained by encoding each of the groups.

In other embodiments, the data channel may be a communications channel. Hence, an embodiment of a third aspect of the invention provides a data transmission method including: encoding each of successive groups of K input data symbols by a method according to the first aspect of the invention, wherein the n'(n'−1) code symbols are output to a communications channel; and transmitting via the communications channel the n'(n'−1) code symbols obtained by encoding each of the groups.

Decoding may be based on the product code or may employ a graph-based technique. Hence an embodiment of a fourth aspect of the invention provides a data decoding method for decoding code symbols produced by a data encoding method according to the first aspect of the invention. The data decoding method includes: storing n'(n'−1) code symbols corresponding to respective locations in the triangular subarray, thereby to define the codeword of $C_Q$ having $n^2$ code symbols corresponding to respective locations of the notional array; and decoding the codeword of $C_Q$ by decoding rows and columns of the array in dependence on the product code C, thereby to obtain K decoded data symbols corresponding to the K input data symbols.

An embodiment of a fifth aspect of the invention provides a data decoding method for decoding code symbols produced by a data encoding method according to the first aspect of the invention. The data decoding method includes: storing n'(n'−1) code symbols corresponding to respective locations in the triangular subarray; deriving from the n'(n'−1) code symbols n' row codewords of the product code C, the n' row codewords corresponding to respective successive rows of the codeword of $C_Q$ having $n^2$ code symbols corresponding to respective locations of the notional array; defining a graph having n' nodes corresponding to respective the row codewords, each node being connected to each other node by two edges representing respective common symbols in the two row codewords corresponding to the two connected nodes; and iteratively decoding the row codewords based on the graph.

Further aspects of the invention provide computer programs comprising program code means for causing a computer to perform, respectively, methods according to the first to fifth aspects of the invention. It will be understood that the term "computer" is used in the most general sense and includes any device, component or system having a data processing capability for implementing a computer program. Moreover, a computer program embodying the invention may constitute an independent program or program set or may be an element of a larger program or program set, and may be supplied, for example, embodied in a computer-readable medium such as a disk or an electronic transmission for loading in a computer. The program code means of the computer program may comprise any expression, in any language, code or notation, of a set of instructions intended to cause a computer to perform the method in question, either directly or after either or both of (a) conversion to another language, code or notation, and (b) reproduction in a different material form.

Additional aspects of the invention provide a data encoder, data decoders, data storage apparatus, a transmitter and receivers.

In general, where features are described herein with reference to an embodiment of one aspect of the invention, corresponding features may be provided in embodiments of another aspect of the invention as appropriate.

Figure 2:
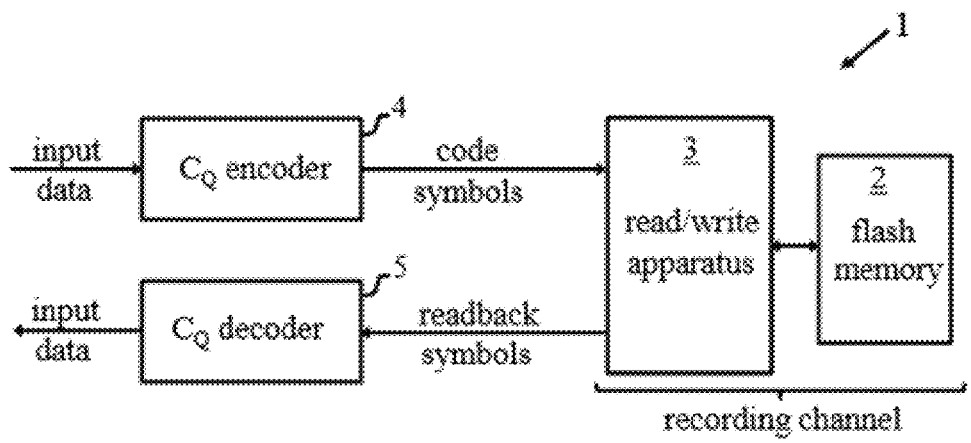
FIG. 2 is a schematic representation of data storage apparatus embodying the invention

FIG. 2 is a schematic block diagram of one embodiment of data storage apparatus for reading and writing ECC encoded data on a storage medium, in this case flash memory. The storage device 1 includes a recording channel containing flash memory 2 and a read/write mechanism comprising apparatus 3 for reading and writing data in memory 2. Though shown as a single block in the figure, flash memory 2 may comprise any desired configuration of flash storage units ranging, for example, from a single chip or die to a plurality of storage banks each containing multiple packages of storage chips. Read/write apparatus 3 performs read and write operations in known manner, addressing individual memory cells for read and write purposes by applying appropriate voltages to an array of word and bit lines in memory ensemble 2. Device 1 further includes a data encoder 4 and a data decoder 5. The encoder 4 encodes input user data into code symbols in accordance with a quarter product code CQ as detailed below, and outputs the code symbols to the recording channel. The data decoder 5 processes the readback symbols from read/write apparatus 4 to decode the quarter product code CQ and so recover the original input data.

In general, functionality of encoder 4 and decoder 5 could be implemented in hardware or software or a combination thereof. For example, the encoding/decoding operation could be performed in whole or in part by software which configures a computer to perform the operations described. For reasons of operating speed, however, the use of hard-wired logic circuits is generally preferred to implement functionality as far as possible. Suitable hardware and software implementations will be apparent to those skilled in the art from the description herein.

Figure 3:
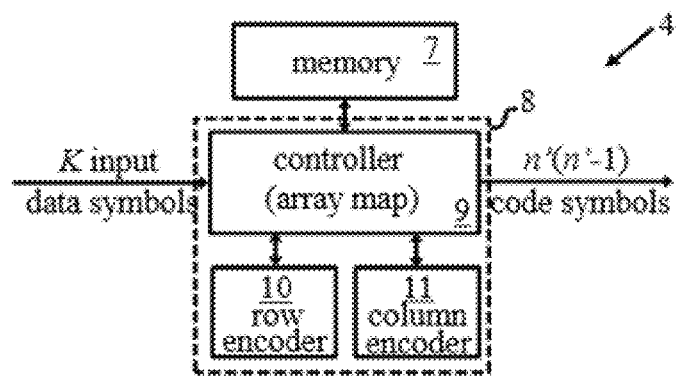
FIG. 3 is a schematic block diagram of a quarter product code encoder in the FIG. 2 apparatus.

FIG. 3 is a more detailed schematic of the $C_Q$ encoder 4. The encoder comprises memory 7 for storing input data symbols and code symbols generated in operation of the encoder, and encoder logic 8. The encoder logic includes a controller 9 for controlling storage and retrieval of symbols in memory 7 in accordance with an array map defined in the encoder logic. The array map defines a mapping between physical locations (symbol addresses) in memory 7 and locations in a notional array described below. Encoder logic 8 also includes a row encoder 10 for encoding symbols in rows of the array, and a column encoder 11 for encoding symbols in columns of the array.

Encoder 4 operates on successive groups of K input data symbols, encoding each group in accordance with quarter product code $C_Q$ to produce n'(n'−1) code symbols for output to the recording channel. The K input data symbols are stored in memory 7 by controller 9, and are thereby assigned, via the mapping specified in the aforementioned array map, to respective symbol locations in the notional array. This notional array is a square array, having n rows and n columns of symbol locations. The assignment of input data symbols to the array (together with additional symbols assigned to array locations as described below) serves to define a plurality of k-symbol words in respective rows of the array. Under control of controller 9, symbols are supplied from memory 7 to row encoder 10 and column encoder 11 which perform the row and column encoding. The resulting code symbols are stored in memory 7 at addresses which map, via the array map, to the appropriate array locations as explained below.

The encoding of rows and columns in row encoder 10 and column encoder 11 is performed in dependence on a product code C which has identical row and column codes C1 and C2. The C1 and C2 code is a reversible error-correction code of dimension k and length n=2n'. The row and column encoding serves to define a codeword Y of the quarter product code $C_Q$. This quarter product code (QPC) codeword Y has $n^2$ code symbols corresponding to respective locations of the notional array. Due to definition of the code $C_Q$ given in detail below, the QPC codeword Y, represented in matrix form with n rows and n columns of code symbols, has a characteristic symmetrical structure. This symmetry is explained below with reference to FIG. 4.

FIG. 4 shows a matrix representation of a simple example of a QPC codeword Y with n=8. All symbols on the diagonal and anti-diagonal are of value zero. In addition, the set of symbols in the shaded triangular subarray confined between the diagonal and anti-diagonal of the n-by-n array is the same set which appears in each of the other three similar triangular subarrays. Specifically, the symbol at any given location i,j in the shaded subarray also appears at mirror locations obtained by reflecting the symbol in the diagonal and anti-diagonal. Thus, for symbol $y_{31}$ in the shaded subarray, reflecting this symbol in the diagonal and anti-diagonal puts like symbols at the mirror locations indicated in the figure. By virtue of this symmetry, the QPC codeword Y is completely defined by the set of n'(n'−1) code symbols in any one of the four triangular subarrays confined between diagonals. This set of code symbols (the individual symbols of which can be selected from various array locations due to the symmetry described) are thus output from memory 7 by controller 9 after the encoding process.

The construction of the quarter product code will now be explained in more detail.

As indicated above, quarter product codes are based on a product code C which has identical row and column codes, each being a reversible error-correction code of dimension k and length n=2n'. The examples to be described employ a BCH code as the reversible component code. Reversible codes have been introduced and extensively studied by Massey in "Reversible Codes," J. L. Massey, Information and Control, vol. 7, No. 3, September 1964, pp. 369-380. In particular, it was shown that there are reversible cyclic $q^{ary}$ BCH codes defined over the finite field $F_q$, which are obtained by suitably choosing the roots of the generator polynomial of the code $C_{base}$ of length n''. In applications, the desired code length n is often shorter than n''. We will describe here how to shorten the cyclic code to obtain a shortened reversible code of length n=2n'<n'' and provide a suitable generator matrix G for encoding.

Let $C_{base}$ be a cyclic reversible code of length n'' and dimension k'' characterized by some parity check matrix H''. We consider the subcode that consists of all codewords $x=x_1 x_2 \ldots x_{n''}$ whose middle components are zero, i.e., $x_i=0$ for i=n'+1, n'+2, \ldots, n''-n'-1. By construction, this subcode C' is reversible. Moreover, its effective length (by removing the middle zeros) is n=2n' and it has dimension k=n-(n''-k''). This subcode can be characterized by a parity check matrix H, which is obtained from H'' by removing the n''-2n' middle columns.

Since $C_{base}$ is cyclic, it has a systematic generator matrix G'' that generates codewords with k'' uncoded (systematic) components in the middle and with parity symbols at the first $\lfloor (n''-k'')/2 \rfloor$ and last $\lfloor (n''-k''+1)/2 \rfloor$ codeword components (here $\lfloor u \rfloor$ denotes the largest integer not exceeding the real number u). In particular, G'' can be written as the concatenation $[P''_L \; I_{k''} \; P''_R]$ of three submatrices: a left (k'' by $\lfloor (n''-k'')/2 \rfloor$)-submatrix $P''_L$, a (k'' by k'') identity matrix in the middle and a right (k'' by $\lfloor (n''-k''+1)/2 \rfloor$)-submatrix $P''_R$. The shortened subcode $C_S$ of length n then has a generator matrix of the form $$G=[P_L I_k P_R].$$

This is a systematic generator matrix with $\lfloor (n-k)/2 \rfloor = \lfloor (n''-k'')/2 \rfloor$ parity symbols at the beginning and $\lfloor (n-k+1)/2 \rfloor = \lfloor (n''-k''+1)/2 \rfloor$ parity symbols at the end.

We now consider a $q^{ary}$ product code C with identical row and column codes $C_S$ with parameters n=2n', k, t (where t indicates the number of errors that can be corrected in a codeword) and rate k/n. We assume that the component code $C_S$ is a reversible $q^{ary}$ code. This implies that:
- if the (n by n)-symbol matrix X is a codeword of C, then so is the transpose matrix $X^T$ because the row and column code are the same;
- if X is a codeword of C, then so is $X^F$ because the row and column code are the same and reversible (where the $X^F$ denotes a reflection of matrix X in the anti-diagonal, i.e., the matrix obtained by flipping all elements of X on the anti-diagonal).

For the product code C, the corresponding quarter product code $C_Q$ is defined as the subcode given by:

$$C_Q=\{X-X^T-(X-X^T)^F: X \in C\}.$$

Note that the $C_Q$ is defined independently of the encoder of the product code C. By construction, every codeword Y of $C_Q$ has a zero diagonal and zero anti-diagonal. By symmetry, the entries in a triangular subarray confined between the two diagonals determine the codeword as illustrated in FIG. 4. Thus, the effective codeword length of the QPC is $N_Q=(n^2-2n)/4=n'^2-n'=n'(n'-1)$.

Let g(.) denote the encoder for the product code C that is obtained by operating the generator matrix G of the component code row-wise and column-wise. In the example to be described, we assume that the input user data for the product code is placed in the center k×k square array within the n×n array, though other locations are of course possible. For encoding of the QPC $C_Q$, the input data can be placed at the center bottom of the upper triangular subarray of the n×n array. This subarray is characterized by the set of indices $I=\{(i,j):i<j, i<n-j\} \cap \{(i,j):i>\lfloor (n-k)/2 \rfloor, j \leq n/2\} \cap \{(i,j):i>\lfloor (n-k+1)/2 \rfloor, j>n/2\}$ In this case, the input space is given by $D=\{U=[u_{ij}] \in F_q^{n \times n}: u_{ij}=0 \text{ for } (i,j) \notin I\}$ and encoding can be done with the encoder g(.) of the product code C:

$$C_Q=\{Y=g(U)+g(U)^T+(g(U)+g(U)^T)^F: U \in D\}$$

A first example of the QPC encoding scheme will now be described based on a product code C with a reversible (n=2n', k, t) component code $C_S$ where k is even, i.e., k=2k'. In this simple example, n'=8 and k'=4, whereby n=16 and k=8. The dimension of the QPC is K==12.

Figures 5B, 6:
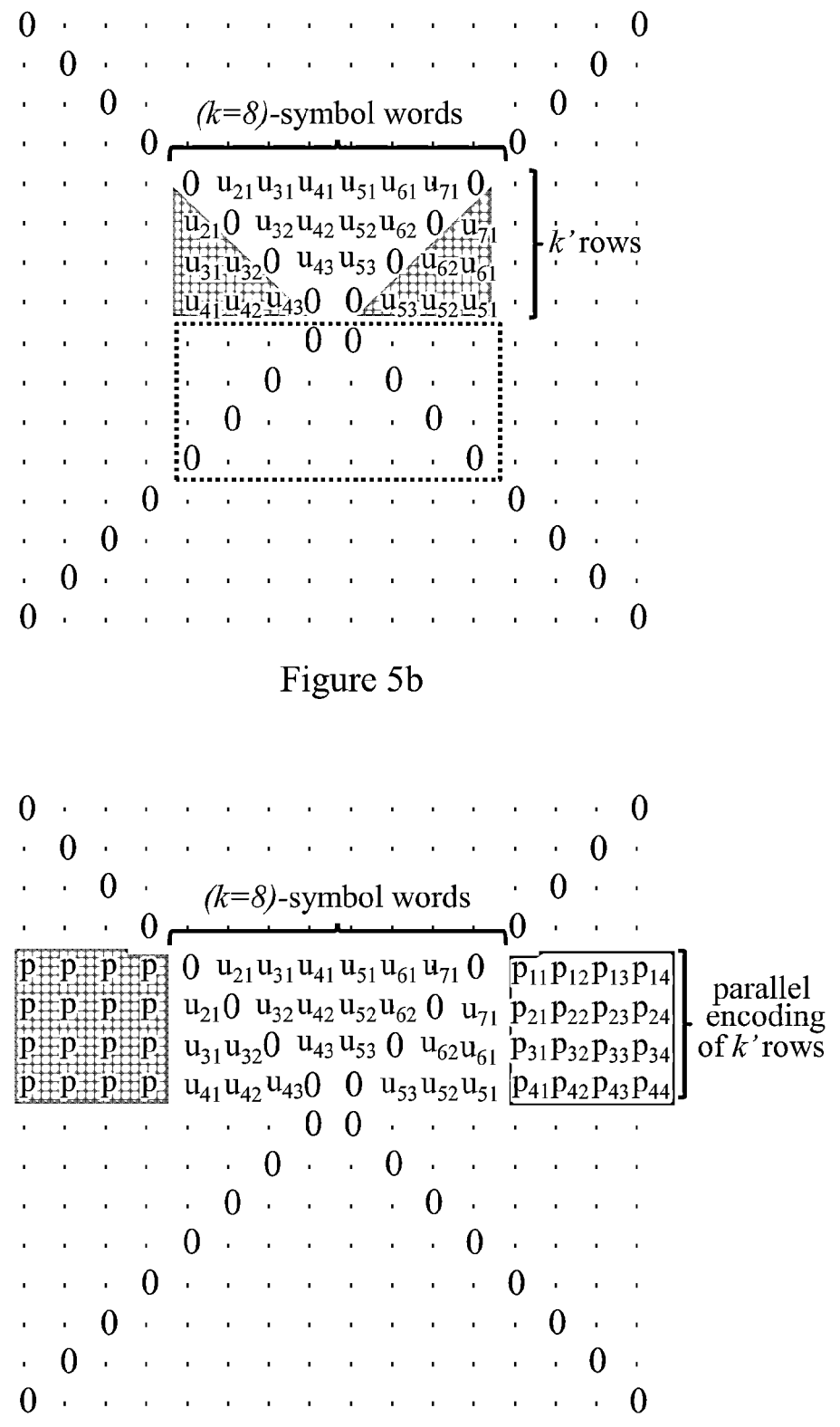

FIGS. 5a and 5b indicate how symbols are assigned to locations in the notional 16×16 array to define the (k=8)-symbol input words for the encoding operation. The K=12 input data symbols (denoted here by $u_{ij}$) are assigned, via the array map in controller 9 of encoder 4, to a set of locations extending from the diagonal to the anti-diagonal and closest to the center of the array. In this example, the input data symbols are assigned to locations in the upper triangular subarray as indicated by the shaded area in FIG. 5a. Controller 9 also assigns further symbols, each of value zero, to all locations on the diagonals. In addition, for the set of input data symbols in the shaded area, controller 9 assigns like symbols to mirror locations of the set by reflecting the input data symbols in the diagonal and anti-diagonal of the array. The resulting symbols at these mirror locations are indicated by shading in FIG. 5b. As a result of this symbol assignment, four (k=8)-symbol words are defined, one in each of the k'=4 successive rows adjacent the center of the array, as indicated in FIG. 5b. Note that, by virtue of the symmetry described above, these k-symbols words also define all symbols in the rectangular subarray bounded by the dotted lines in the figure through reflection of symbols in the diagonals to their respective mirror locations.

Next, the k'=4 successive rows containing the (k=8)-symbol words shown in FIG. 5b are encoded in parallel by row encoder 10 using the systematic generator matrix G of the reversible component code. Since systematic encoding is employed in this embodiment, the input data is retained in the resulting row codewords. Encoding of each row generates four parity symbols (denoted by p in the figure) assigned to the first four locations of the row and four parity symbols (denoted by $p_{ij}$ in the figure) assigned to the last four locations of the row. Encoding of these k'=4 rows results in four rows of n=16 code symbols as shown in FIG. 6, where the parity symbols are indicated by shading. The controller 9 then assigns like code symbols to mirror locations of locations in these rows by reflecting code symbols in these rows in the diagonals of the array. Specifically, the end-of-row parity symbols $p_{11}, p_{12}, \ldots, p_{44}$ form a 4×4 parity array which is reflected in the diagonals, corresponding to a 180-degree rotation of the parity array, to the mirror locations indicated by shading in FIG. 7. (By virtue of the symmetry described above, the row encoding step also serves to define all symbols in the rectangular subarrays bounded by dotted lines in the figure).

The row encoding step thus defines a subset of the $n^2$ code symbols for the array. In the ensuing column encoding step, sufficient columns of the array are encoded to define the remainder of the $n^2$ code symbols for the array. In this example, the middle k=8 locations in each of (n'-k'-1)=3 successive columns at the left-hand edge of the array provide the inputs for the row encoding stage. Each of these columns is encoded in parallel by column encoder 11 using the systematic generator matrix G of the reversible component code. This generates the parity symbols, denoted by p', at the locations shown in FIG. 8. The parity symbols for the $(n'-k'=4)^{th}$ column in from the left are also defined by symmetry from the parity symbols p' in the first three columns. The column encoding step thus defines the parity symbols shown in the shaded regions of FIG. 8. In addition, symbols in the two square subarrays bounded by dotted lines in the figure are also defined by symmetry, whereby all $n^2$ code symbols for the array are defined following column encoding.

Due to the symmetry, the resulting codeword Y of the quarter product code $C_Q$ is fully defined by the set of $n'(n'-1)=56$ code symbols in any one of the four triangular subarrays confined between the array diagonals. This set of code symbols is supplied by controller 9 as the output of $C_Q$ encoder 4. Of course, since the same symbol appears at multiple array locations, the individual $n'(n'-1)=56$ output symbols corresponding to locations in the triangular subarray can be selected by controller 9 from multiple array locations as convenient. By way of example, the selection of output symbols in this embodiment is indicated by shading in FIG. 9. The output consists of the input data (because of the systematic encoding) and the parity symbols that lie in the intersection of the left triangular subarray and the first $(n'-k')=4$ columns. It can be seen that, by symmetry, these 56 code symbols are the same symbols which appear at the 56 locations in any triangular subarray between the diagonals.

It will be understood that, while all $n^2$ code symbols in the array are defined by the above encoding process, not all code symbols need actually be stored in memory 7 because of the codeword symmetry. The way in which symbols are actually written and read in memory 7, and thus also the memory requirement, will depend on the particular hardware architecture employed. If the row and column encoding steps described above generate all symbols in the encoded rows and columns, then a memory of size $((n'-k')^2+n'(n'+k'))<2n'^2$ (here 112<128) symbols is required. This corresponds to the regions of the array bounded by the vertical and horizontal rectangles in FIG. 9. To save memory here, the 4×4 parity array of parity symbols $p_{11}, p_{12}, \ldots p_{44}$ in FIG. 6 could be stored only once, corresponding to the mirror locations in the first n'-k' columns shown FIG. 7.) In general, however, many memory architectures can be envisaged here, with the overall minimum memory requirement being 56 symbols.

Another example of the QPC encoding scheme is illustrated in FIGS. 10a to 10e. This example is based on a product code C with a reversible (n=2n', k, t) component code $C_S$ where k is odd, i.e., k=(2k'+1). In this simple example, n'=7 and k'=3, whereby n=14 and k=7. The dimension of the QPC is $K=k'^2=9$.

Figures 9, 10A:
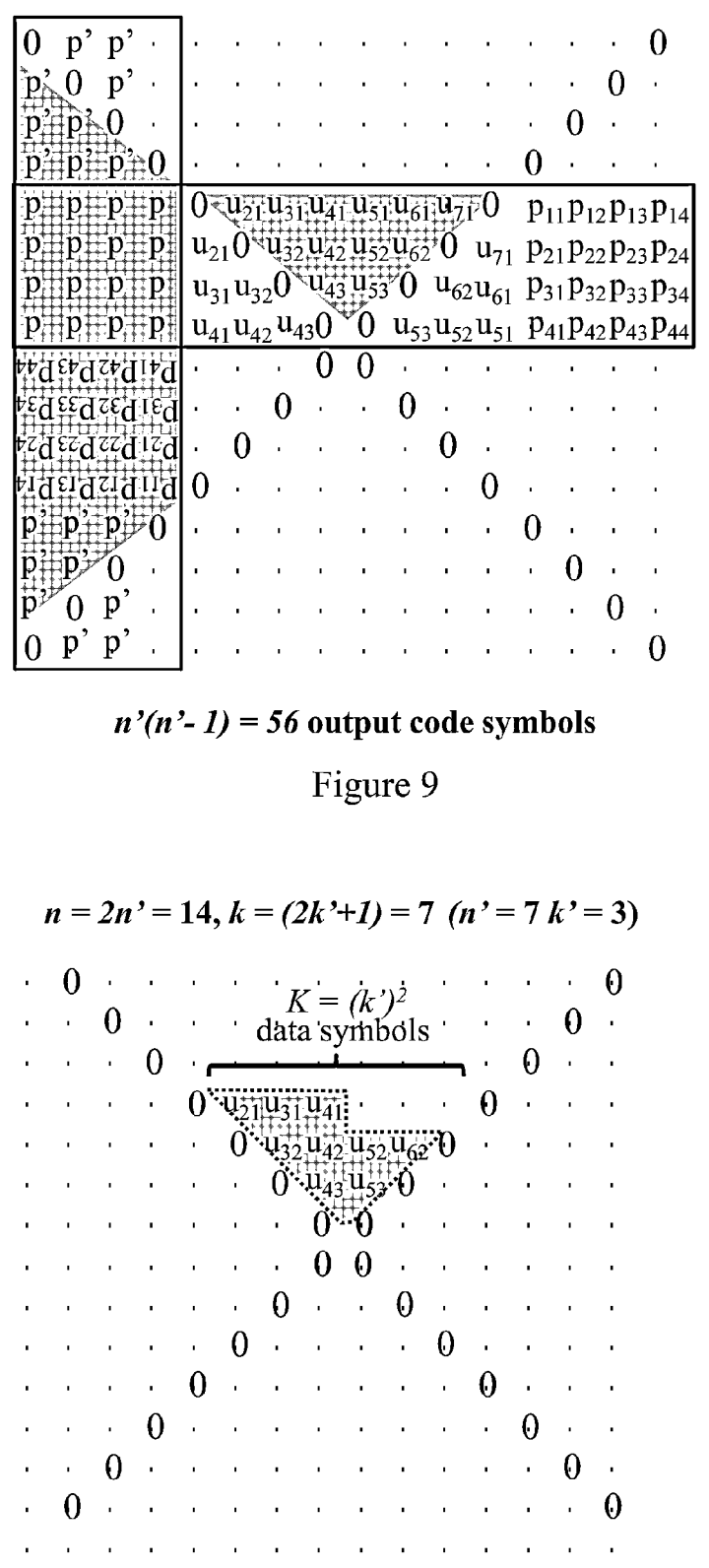

FIG. 10a indicates assignment of the K=9 input data symbols to locations in the upper triangular subarray of the 14×14 array. FIG. 10b indicates assignment of like symbols to mirror locations of the input data symbols to define three (k=7)-symbol words, one in each of the k'=3 successive rows adjacent the center of the array. FIG. 10c illustrates the result of row encoding of these k'=3 rows using the systematic generator matrix G of the reversible component code. Three parity symbols (denoted by p in the figure) are assigned to the first three locations of each row. Four parity symbols (denoted by $p_{ij}$ in the figure) are assigned to the last four locations of each row. Like code symbols are assigned to mirror locations of the end-of-row parity symbols $P_{11}$, $P_{12}, \ldots, p_{34}$ as indicated by the arrow in FIG. 10d. At the end of the row encoding step, code symbols are defined for the middle six locations in each of $(n'-k')=4$ successive columns at the left-hand edge of the array. The $(n'-k'=4)^{th}$ column in from the left is encoded first in column encoder 11 using the systematic generator matrix G of the reversible component code. This generates the parity symbols $p_1', \ldots, p_6'$ shown in FIG. 10d for this column. The first three parity symbols $p_1', p_2', p_3'$ are then assigned to their mirror locations in the first three columns at the beginning of the $4^{th}$ row. This is indicated by the arrow in FIG. 10e. The first three columns are then encoded in parallel by column encoder 11 using the systematic generator matrix G of the reversible component code. This defines all parity symbols denoted by p" in FIG. 10e. The output consists of the $n'(n'-1)=42$ output symbols corresponding to locations in a triangular subarray between the diagonals. Again these symbols can be obtained, for example, from the input data symbols and the parity symbols that lie in the intersection of the left triangular subarray and the first $(n'-k')=4$ columns.

The minimum memory requirement for the second example is 42 symbols. However, if row and column encoding steps operate over entire rows and columns, then a memory of size $((n'-k')^2+n'(n'+k'))<2n'^2$ (here 86<98) symbols is required. To save memory here, the 3×4 parity array of parity symbols $p_{11}, p_{12}, \ldots, p_{34}$ in FIG. 10c could be stored only once, corresponding to the mirror locations in the first n'-k' columns shown FIG. 10d.) Again, however, many possible memory architectures can be envisaged.

Figure 11:
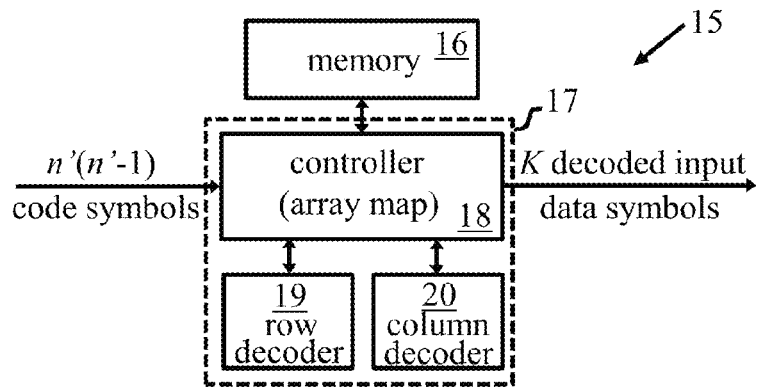
FIG. 11 is a schematic block diagram of a quarter product code decoder for the FIG. 2 apparatus.

The same memory structure used in the encoding operations above can be employed in $C_Q$ decoder 5 for the decoding operation. FIG. 11 is a schematic diagram of a first embodiment of the $C_Q$ decoder. This decoder 15 comprises memory 16 and decoder logic 17. Memory 16 stores $n'(n'-1)$ readback code symbols received from the channel and symbols generated in operation of the decoder. The decoder logic 17 includes a controller 18, a row decoder 19 and a column decoder 20. Controller 18 controls storage and retrieval of symbols in memory 16, in accordance with the array map discussed above, during the decoding operation. In particular, the $n'(n'-1)$ readback code symbols define an input $C_Q$ codeword, having $n^2$ code symbols corresponding to respective array locations, for the decoding operation. The row and column decoders 19 and 20 operate to decode this input codeword by decoding rows and columns of the array in dependence on the product code C, exploiting the symmetries in the array described above. The decoding proceeds iteratively on rows and columns, similar to the way turbo product codes are decoded. The decoder thus operates to produce K decoded data symbols corresponding to the original K input data symbols for the $C_Q$ codeword. These K data symbols provide the output of the decoder.

Figure 12:
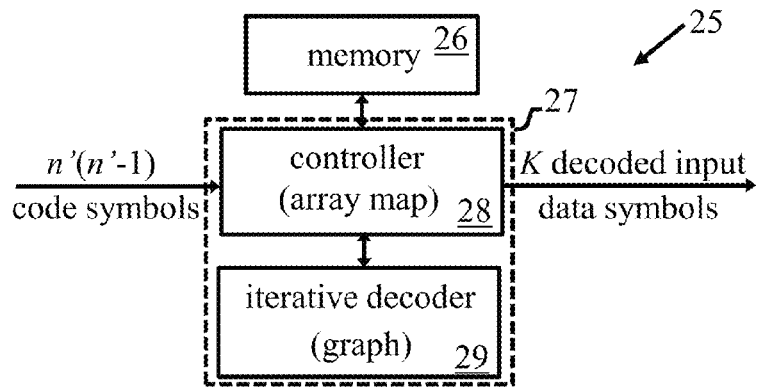
FIG. 12 is a schematic block diagram of an alternative quarter product code decoder.
Figure 13:
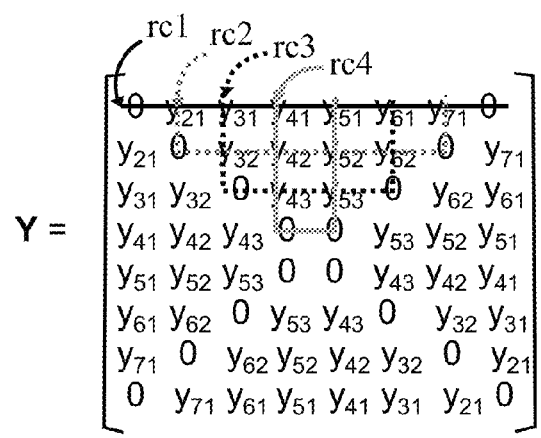
FIG. 13 indicates derivation of row codewords in operation of the FIG. 12 decoder.

While decoder 15 decodes the $C_Q$ code as a product code, an alternative implementation can exploit a graph-based decoding technique. An example of such a decoder is illustrated schematically in FIG. 12. This decoder 25 comprises memory 26 and decoder logic 27, including controller 28, generally as for decoder 15 above, but an iterative decoder 29 replaces the row and column decoders of FIG. 11. In operation, controller 28 uses the array map to derive n' row codewords of the product code C from the $n'(n'-1)$ readback code symbols received from the channel. In particular, the $n'(n'-1)$ readback symbols define an input $C_Q$ codeword with $n^2$ code symbols corresponding to respective array locations. The n' row codewords of the product code C correspond to respective successive rows of this input codeword. An example of how the row codewords are derived is indicated in FIG. 13 for the simple codeword Y of FIG. 4.

The $n'(n'-1)$ readback code symbols correspond to respective locations in the upper triangular subarray between the array diagonals. These symbols define an input $C_Q$ codeword with $n^2$ code symbols corresponding to respective array locations. The n'=4 row codewords corresponding to the first four rows of the array are fully defined by the input code symbols in accordance with the four lines labelled rc1 to rc4 in FIG. 13. In effect, the first n' row codewords rc1 to rcn' are "folded" into the triangular subarray including the bounding diagonal symbols which are zero by construction.

The row codewords rc1 to rcn' are supplied to iterative decoder 29 which defines a graph based on these codewords. Such a graph is illustrated schematically in FIG. 14 for the array of FIG. 13. The graph has n' nodes corresponding to respective row codewords rc1 to rcn'. Each node is connected to each other node by two edges. The edges between two nodes represent respective common symbols in the two row codewords corresponding to those nodes. In particular, consideration of FIG. 13 shows that each pair of row codewords rc1 to rcn' intersect at two locations and thus have two symbols in common. Based on such a graph, decoder 29 can perform iterative decoding of the row codewords rc1 to rcn' as will be apparent to those skilled in the art. Briefly, decoder 29 can decode the row codewords one-by-one. Each time a row codeword is successfully decoded, symbol-values associated with the edges leaving the corresponding node are corrected accordingly. The process then iterates until all codewords have been decoded successfully or a predetermined maximum number of iterations has been reached. The resulting K decoded data symbols corresponding to the original K input data symbols are then output by controller 28.

The QPC schemes described above offer complexity-efficient, reliable ECC systems with much smaller codeword lengths than prior product-code based codes. This allows longer, stronger component codes to be used for a given code length, leading to fewer decoding errors and improved ECC performance. QPC schemes offer enhanced flexibility in design of ECC schemes with simple, efficient encoder/decoder implementations, and good performance even at small code lengths. For example there exist interesting instances of QPCs for flash applications, such as: a QPC of rate 0.852 and length 71,022, (based on a component (n=534, k=493, t=4) BCH code) which fits on a 8 kB physical MLC-Flash page; and a QPC of rate 0.860 and length 79,242, based on a component (n=564, k=523, t=4) BCH code, which has dimension 68,121 and, thus, can hold a 8 kB logical MLC-Flash page. Further instances of interesting QPCs are as follows: a rate-0.836 QPC of length 46,872 and dimension 39,204 (based on a component (n=434, k=397, t=4) BCH code) which fits into a third of a 16 kB physical MLC-Flash page; a rate-0.826 QPC of length 41,412 and dimension 34,225 (based on a component (n=408, k=371, t=4) BCH code) which can hold a 4 kB logical MLC-Flash page.

Figures 14, 15:
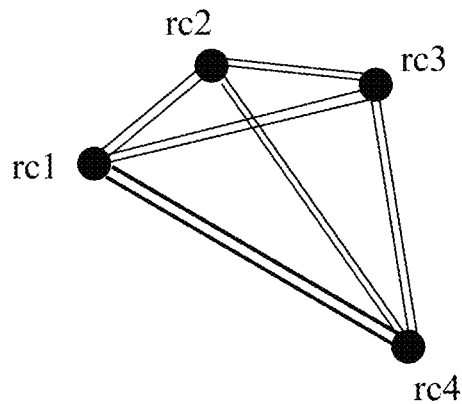
FIG. 14 is a schematic representation of a graph defined in operation of the FIG. 12 decoder.
FIG. 15 is a table of properties of four codes.
Figure 16:
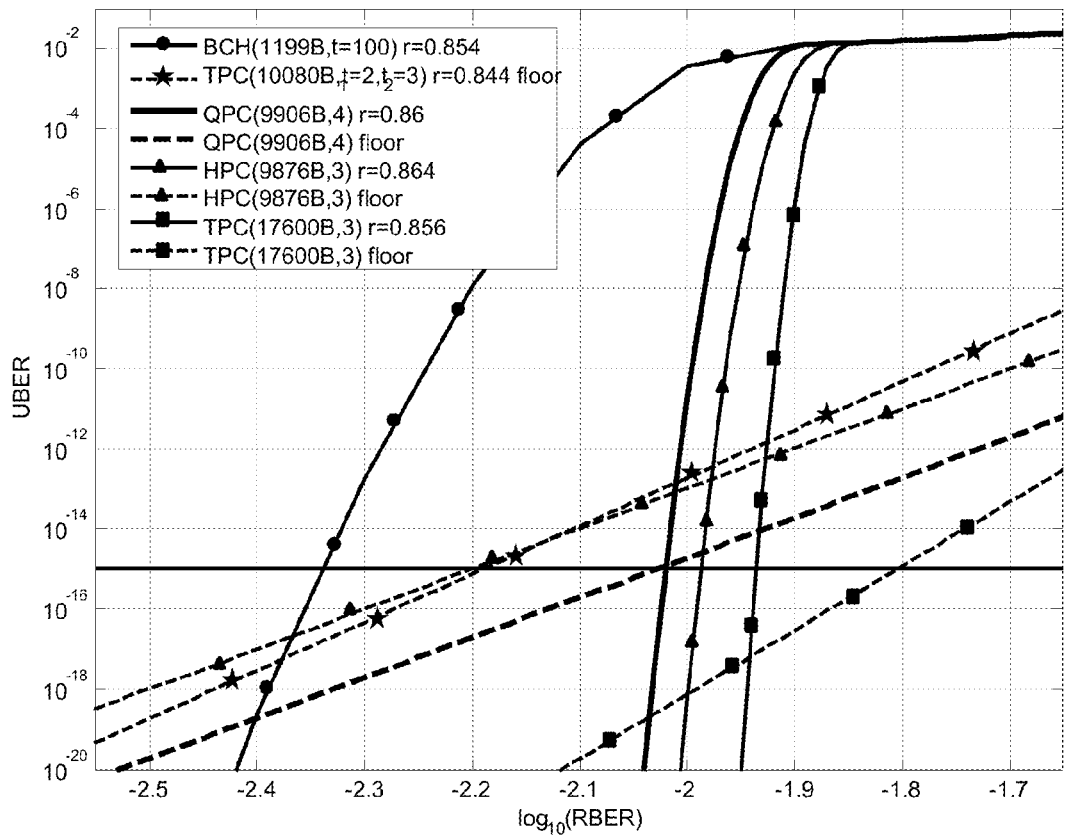
FIG. 16 is graph illustrating performance of the properties indicated in FIG. 15.

By way of illustration, parameters of the length-79,242 QPC are indicated in FIG. 15, together with parameters of three other codes, namely a rate 0.856 turbo product code (TPC), a rate 0.844 TPC, and a rate 0.864 half product code (HPC). FIG. 16 indicates performance of these codes, together with a rate 0.854 (n=9592, k=8192, t=100) BCH code, in terms of output versus input bit error rates (BERs) of the decoder. The performance curves are based on analytical approximations that relate the raw channel bit error rate (RBER) at the decoder input to the unrecoverable bit error rate (UBER) at the decoder output. The QPC, like the other codes here, can be fully characterized down to the error floor, permitting such analysis. The dashed curves indicate performance of the corresponding code on the error floor. The horizontal line in this plot corresponds to a target BER of $10^{-15}$. The corresponding input (raw) BER for the codes at this target rate (assuming no mis-corrections) is also indicated in FIG. 15. The rate 0.844 TPC and the rate 0.864 HPC have already hit the error floor at the target rate. It can be seen that the QPC meets the $10^{-15}$ target error rate, giving better performance with less than half the code length of the HPC, and thus significantly higher read bandwidth. Indeed, performance of the QPC is only marginally below that of the rate 0.856 TPC, even with the much smaller code length and much higher read bandwidth.

While particular examples are given above, numerous other QPCs exist and various alternative encoder/decoder implementations are possible as will be apparent to those skilled in the art. As indicated earlier, the QPC is defined independently of the encoder of the product code C. Clearly, the encoder detailed above is not unique and many other encoders exist. For example, one can choose any K-dimensional subspace D of the n×n $q^{ary}$ array $F_q^{n \times n}$ and any encoder g(.) of the n×n product code C provided that the kernel of the linear map f: D→$F_q^{n \times n}$, given by f(U)=g(U)+$g(U)^T$+$(g(U)+g(U)^T)^F$, is zero. One skilled in the art can readily find other ways to obtain equivalent encoders to that described for the reversible component code, e.g., by considering linear feedback shift register encoders, or other encoders with parity symbols in the middle of the codewords, or other non-systematic encoders. The reversible component code may be based on codes other than BCH codes, and other embodiments may use non-systematic encoding of the input data.

Figure 17:
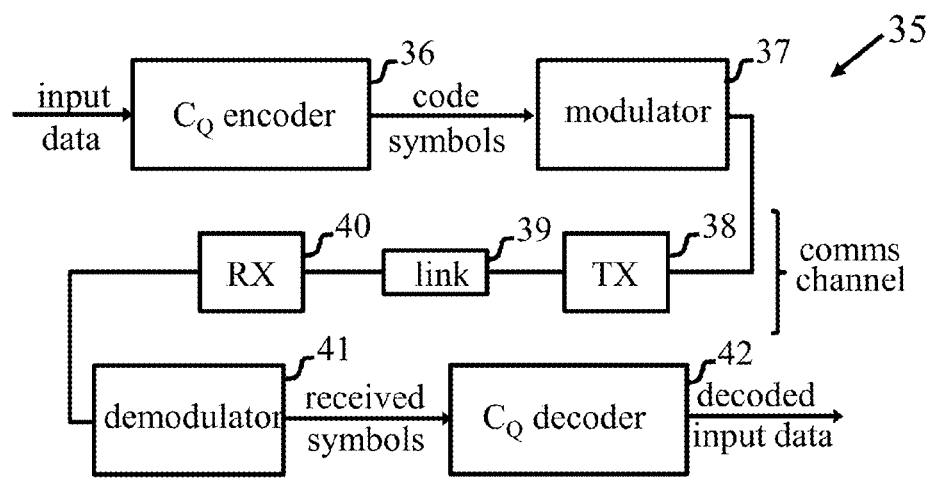
FIG. 17 is a schematic representation of data communications apparatus embodying the invention.

QPCs may of course be applied to ECC schemes in other applications such as storage applications with a storage medium other than flash memory, e.g., other types of solid-state memory devices, as well as transmission applications. FIG. 17 shows a simplified schematic of such a transmission system 35. The transmitter of the system comprises a $C_Q$ encoder 36 as described above, a modulator 37, and a transmission device (TX) 38. Code symbols output by $C_Q$ encoder 36 are supplied, via modulator 37, to a data communications channel wherein transmission device 38 generates a signal for transmitting the code symbols over a communications link 39. The link 39 here may in general comprise a physical (wired or wireless) link or a logical link over a plurality of physical links. A receiver of the system comprises a receiving device (RX) 40 for receiving the signal transmitted over link 39, a demodulator 41 for demodulating the received signal, and a $C_Q$ decoder 42 as described above for decoding the resulting code symbols received from the demodulator.

While the row and column encoding is ideally performed by parallel encoding of rows and columns respectively as far as possible, rows and columns could of course be encoded sequentially in some embodiments.

It will be appreciated that many other changes and modifications can be made to the exemplary embodiments described without departing from the scope of the invention.

The present invention may be a system, a method, and/or a computer program product. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punchcards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention.

In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The invention claimed is:
1. A storage device comprising:
a memory for storing a first number (K) of input data symbols;
encoder logic for enabling correction of errors in the input data symbols in response to a channel, wherein the encoder logic comprises
a controller to map physical locations of the K input data symbols to respective symbol locations in a notional square array to define a plurality of symbol words in respective rows of the notional square array, wherein the notional square array has an equal number (n) of rows and columns of symbol locations and each symbol word of the plurality of symbol words have a second number (k) of symbols,
a row encoder and a column encoder
to encode the plurality of symbol words by respectively encoding rows and columns of the notional square array using a product code (C) having identical row and column codes,
  each of the row and column codes being a reversible error-correction code having a numeric dimension equal to k and a numeric length (n), wherein n is twice as large as a third number (n'),
to determine a first codeword (X) of C,
  wherein X comprises a symbol matrix having n rows and n columns and each symbol in X corresponds to respective locations in the notional square array,
to generate, using X, a quarter product code ($C_Q$) in the notional square array,
  wherein $C_Q$ is determined from a difference between a first matrix and a second matrix, the first matrix derivable from a difference between X and a matrix transpose of X, the second matrix derivable from a reflection of the first matrix in an anti-diagonal of the first matrix, and
wherein the controller outputs to a transmitter circuit a fourth number of code symbols in a codeword of $C_Q$ which correspond to respective locations in a triangular subarray confined between a diagonal of the notional square array and an anti-diagonal of the notional square array,
wherein the fourth number equals to n' multiplied by the quantity of n' reduced by one, and
wherein the fourth number of code symbols includes both data symbols and parity symbols for regenerating the K input data symbols in response to an error in the k fourth number of data symbols caused by a channel;
a transmitter to transmit the fourth number of code symbols over the channel;
a data storage medium; and
a read/write circuit configured to read and write data on the storage medium, wherein the encoder logic is further configured to output the fourth number of code symbols of the codeword of $C_Q$ to the read/write circuit for storage on the storage medium,
  wherein the data storage medium comprises flash memory.

2. The storage device of claim 1, further comprising a decoder logic configured to decode the codeword of $C_Q$ by,
  generating, using the fourth number of code symbols of the codeword of $C_Q$, a second notional square array,
  decoding rows and columns of the second notional square array using the on the product code C to obtain K decoded data symbols corresponding to the K input data symbols.

3. The storage device of claim 1, further comprising a decoder logic configured to
  derive, from the fourth number of code symbols of the codeword of $C_Q$, n' row codewords of the product code C, the n' row codewords corresponding to respective successive rows of the codeword of CQ having n2 code symbols corresponding to respective locations of the notional array,
  define a graph having n' nodes corresponding respectively to the row codewords, wherein a first node of the n' nodes is connected to a second node of the n' nodes by two edges representing respective common symbols in two row codewords corresponding respectively to the first node and the second node, and
  iteratively decode the row codewords using the graph.

* * * * *